United States Patent [19]

Wu et al.

[11] Patent Number: 5,192,523
[45] Date of Patent: Mar. 9, 1993

[54] METHOD FOR FORMING DIAMONDLIKE CARBON COATING

[75] Inventors: Richard L. Wu, Xenia; Peter P. Pronko, Kettering, both of Ohio

[73] Assignee: Universal Energy Systems, Inc., Dayton, Ohio

[21] Appl. No.: 707,319

[22] Filed: May 28, 1991

Related U.S. Application Data

[63] Continuation of Ser. No. 362,642, Jun. 7, 1989, abandoned.

[51] Int. Cl.$^5$ .............................................. C01B 31/04
[52] U.S. Cl. ...................................... 427/523; 501/86; 427/577; 204/157.47; 204/173; 423/446
[58] Field of Search ..................... 423/446; 501/86; 427/39; 204/173, 157.47; 156/DIG. 68

[56] References Cited

U.S. PATENT DOCUMENTS

| | | | |
|---|---|---|---|
| 3,961,103 | 6/1976 | Aisenberg | 423/446 |
| 4,437,962 | 3/1984 | Banks | 423/445 |
| 4,504,519 | 3/1985 | Zelez | 423/446 |
| 4,740,263 | 4/1988 | Imai et al. | 156/DIG. 68 |

FOREIGN PATENT DOCUMENTS

| | | | |
|---|---|---|---|
| 60-103099 | 6/1985 | Japan | 423/446 |
| 60-17298 | 7/1985 | Japan | 501/86 |
| 61-151096 | 7/1986 | Japan | 423/446 |
| 62-132800 | 6/1987 | Japan | 423/446 |
| 1485364 | 9/1977 | United Kingdom | 423/446 |

Primary Examiner—Robert Kunemund
Attorney, Agent, or Firm—Reinhart, Boerner, Van Deuren, Norris & Rieselbach

[57] ABSTRACT

A method of depositing a diamondlike carbon coating on a substrate. An ionized beam of pure methane or methane and hydrogen, and having an ion kinetic energy in the range of 500-1,000 eV is impinged on a substrate to deposit, thereon, a diamondlike carbon coating. Various substrates can be utilized, and various cleaning procedures are developed for use with the particular substrates to improve the adhesion of the diamondlike carbon coatings. The methane-hydrogen ratio and the operating pressure of the ionized gas can each be varied to vary the carbon-hydrogen ratio of the resulting diamondlike coating to thereby alter the characteristics of the coating.

23 Claims, 7 Drawing Sheets

METHOD FOR FORMING DIAMONDLIKE CARBON COATING

This is a continuation of copending application Ser. No. 07/362,642, filed on Jun. 7, 1989, now abandoned.

BACKGROUND OF THE INVENTION

This invention relates generally to the formation of diamondlike carbon coatings through ion-beam deposition.

Diamondlike carbon coatings, which typically comprise an amorphous combination of carbon and hydrogen, provide a durable, hard and transparent protective coating for optical and other surfaces. When so utilized, it is important that such coatings be uniform, be free from defects such as pinholes and cracks, and adhere well to the underlying surface or substrate.

A number of generally well known techniques, including ion-beam deposition and plasma discharge, currently exist for forming diamondlike carbon coatings on various types of substrates. The majority of these processes avoid ion-beam deposition because of difficulties in forming uniform layers over large surface areas and also because of rather complicated apparati needed for production of the diamondlike carbon coatings by ion-beam deposition.

In view of the foregoing, it is a general object of the present invention to provide a new and improved method for forming a diamondlike carbon coating on a substrate.

It is a further object of the present invention to provide a new and improved method for forming a diamondlike carbon coating that is uniform and free of pinholes and other defects.

It is another object of the invention to provide an improved method of ion-beam deposition over relatively large surface areas.

It is a still another object of the present invention to provide a new method for forming a diamondlike carbon coating that is durable and adheres well to a variety of substrates.

It is an additional object of the present invention to provide a new and improved method for forming a diamondlike carbon coating that is highly resistant to attack by a variety of solvents and other chemical compounds.

SUMMARY OF THE INVENTION

The invention provides a method for forming a diamondlike carbon coating on a substrate comprising the steps of generating a carbon containing ionized beam having an ion kinetic energy in a preferred range of roughly 500 to 1500 eV, and impinging the ionized beam onto the substrate.

In one aspect of the invention, the carbon containing ionized beam includes a hydrocarbon, such as methane alone or in combination with hydrogen.

In one aspect of the invention, the method is utilized within a vacuum chamber having an ambient background pressure of about $10^{-6}$ torr and the operating pressure within the vacuum chamber during formation of the coating on the substrate is in the range of substantially $10^{-5}$ to $10^{-4}$ torr.

Deposition of the diamondlike carbon coating can be accomplished over a wide area by use of a rastering device. The resulting coating is highly uniform, of high quality and covers a desired large area of a substrate.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

The invention provides a method of forming, on a substrate, a diamondlike carbon coating having a number of desired qualities such as uniformity, transparency, high resistivity, durability, resistance to solvents and other chemical compounds and strong adhesion to the underlying substrate. By use of a rastering device, the coating can readily cover large areas while maintaining high quality. The diamondlike carbon coating consists essentially of amorphous carbon and hydrogen in approximately the ratio 70% carbon and 30% hydrogen.

Figure 1:
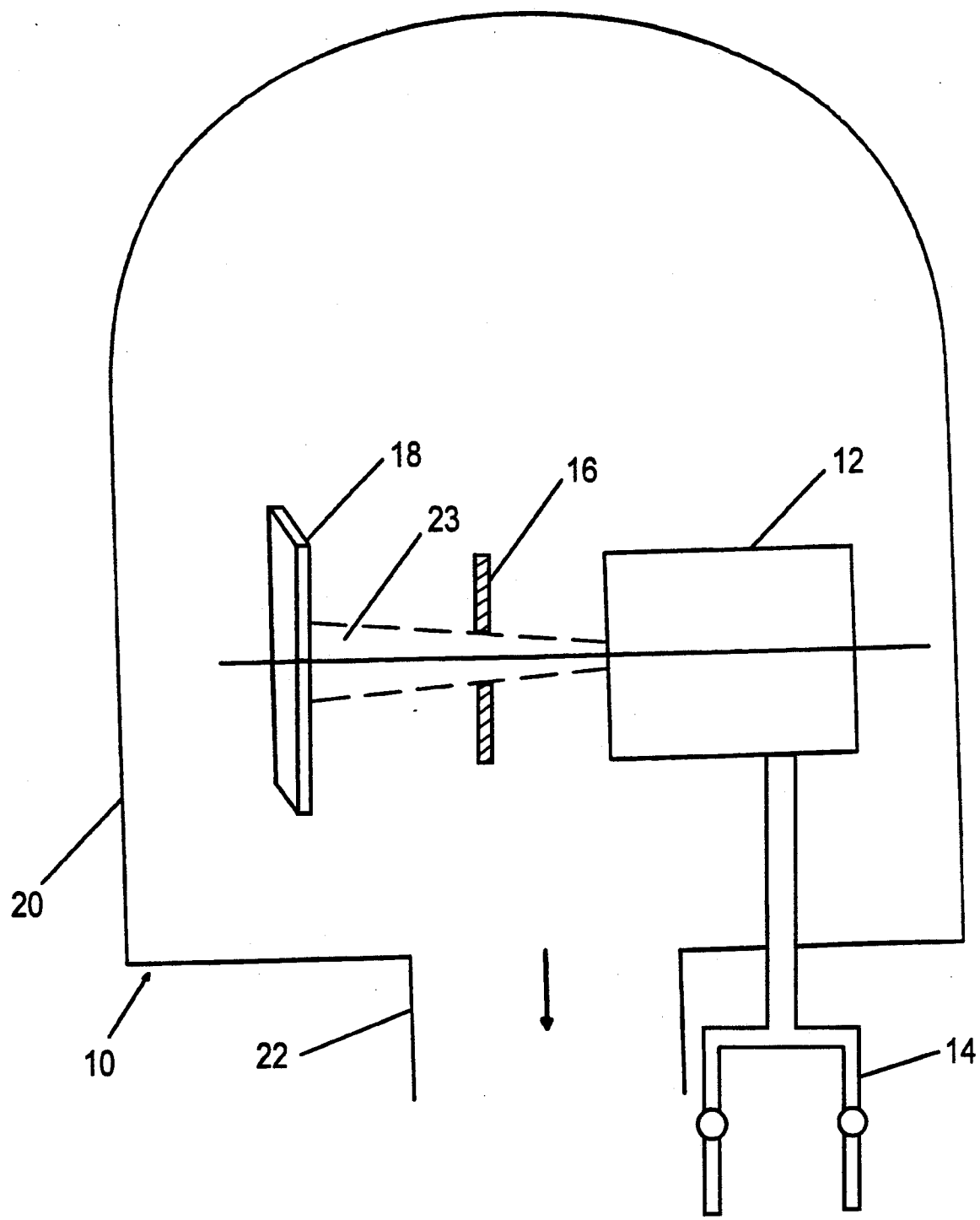
FIG. 1 is a simplified diagramatic view of one apparatus for implementing the process of the present invention.

An apparatus 10 for forming a diamondlike carbon coating in accordance with the method of the present invention is illustrated in FIG. 1. The apparatus 10 includes a straightforward, conventional ion source assembly 12 for generating a carbon-containing ion beam, a gas inlet system 14 for permitting the introduction of pre-mixed gases into the ion source assembly 12 and a collimator 16 for collimating the ion beam generated by the ion source assembly 12. In addition, the apparatus 10 includes a target fixture 18 for supporting the substrate to be coated with the diamondlike carbon coating. A vacuum system, comprising a glass bell jar 20 and a diffusion pump (not shown) operating through a liquid nitrogen trap portion 22, provides an ambient background pressure of substantially $10^{-6}$ torr.

Figure 2:
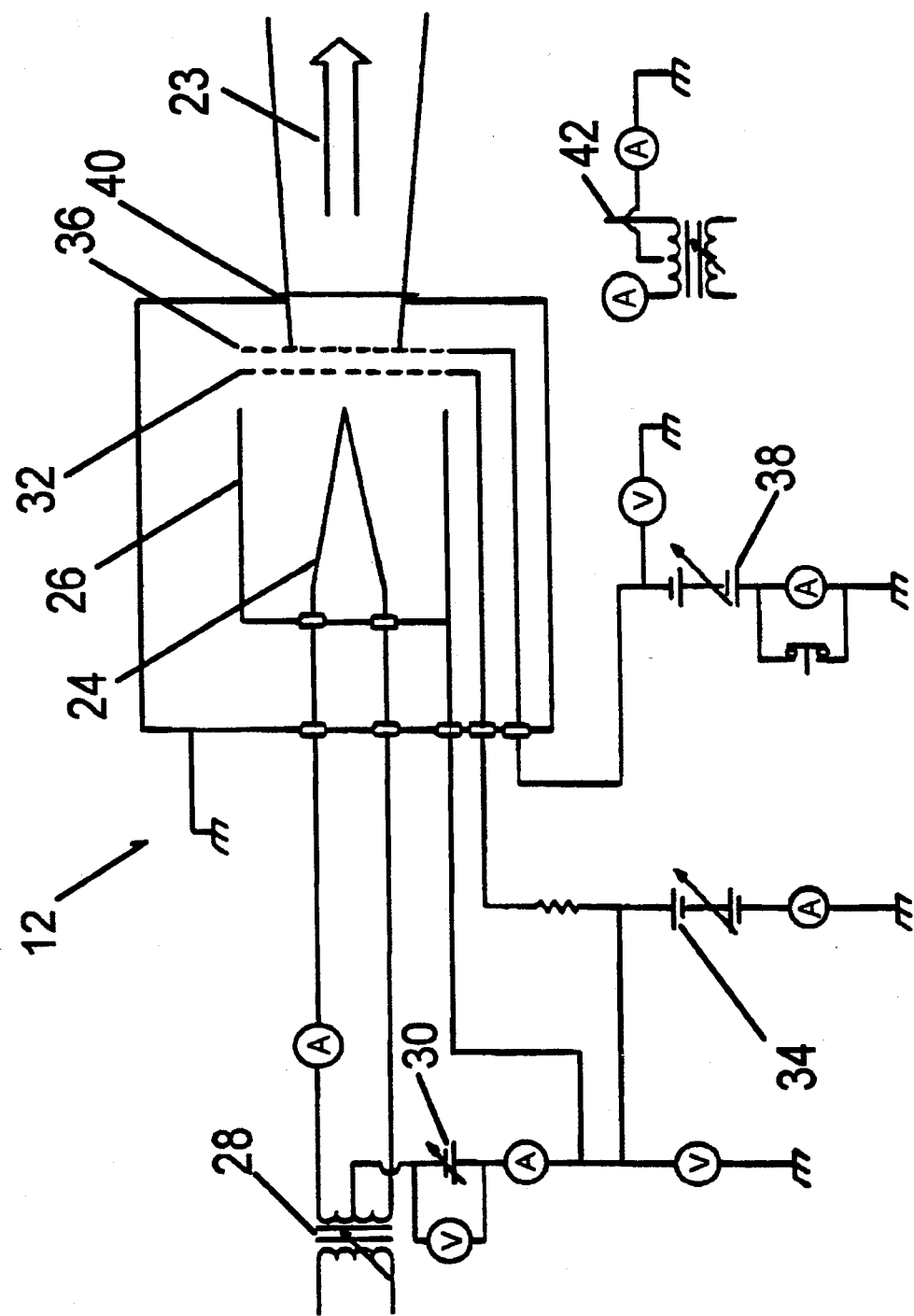
FIG. 2 is a simplified electrical schematic diagram of an ion source useful in practicing the method of the present invention.

The ion source assembly 12 preferably comprises a commercially available unit such as a 2.5 cm diameter Kaufman source manufactured by Ion-Tech, Inc., and this Kaufman unit is shown schematically in FIG. 2. An ion beam 23 is produced by plasma discharge between a negatively charged heated filament 24 and a relatively positively charged ion box 26. Filament current is provided by means of a center-tapped transformer 28, and the discharge potential between the filament 24 and the ion box 26 is provided by means of a variable first, or discharge, voltage source 30 connected between the ion box 26 and the center tap of the filament current transformer secondary. A positively charged anode grid 32 is positioned adjacent the discharge end of the ion box 26 and is coupled to the positive polarity terminal of a variable second, or beam, voltage source 34. To help focus the ion beam, the ion source assembly 12 further includes an accelerator grid 36 positioned beyond the anode grid 32 and coupled to a third variable, or accelerator, voltage source 38. The kinetic energy of the ion beam 23 can be controlled by means of the beam and accelerator voltages. A neutralizer wire 40, coupled to a neutralizer current source 42, neutralizes any electron plasma in the vicinity of the ion beam outlet.

The gas inlet system 14 functions to permit the introduction of two pre-mixed gases into the ion source assembly 12. Typically, the two gases are methane and hydrogen, and the flow rate of each gas is independently controlled by means of a conventional MKS flow controller.

Figure 3:
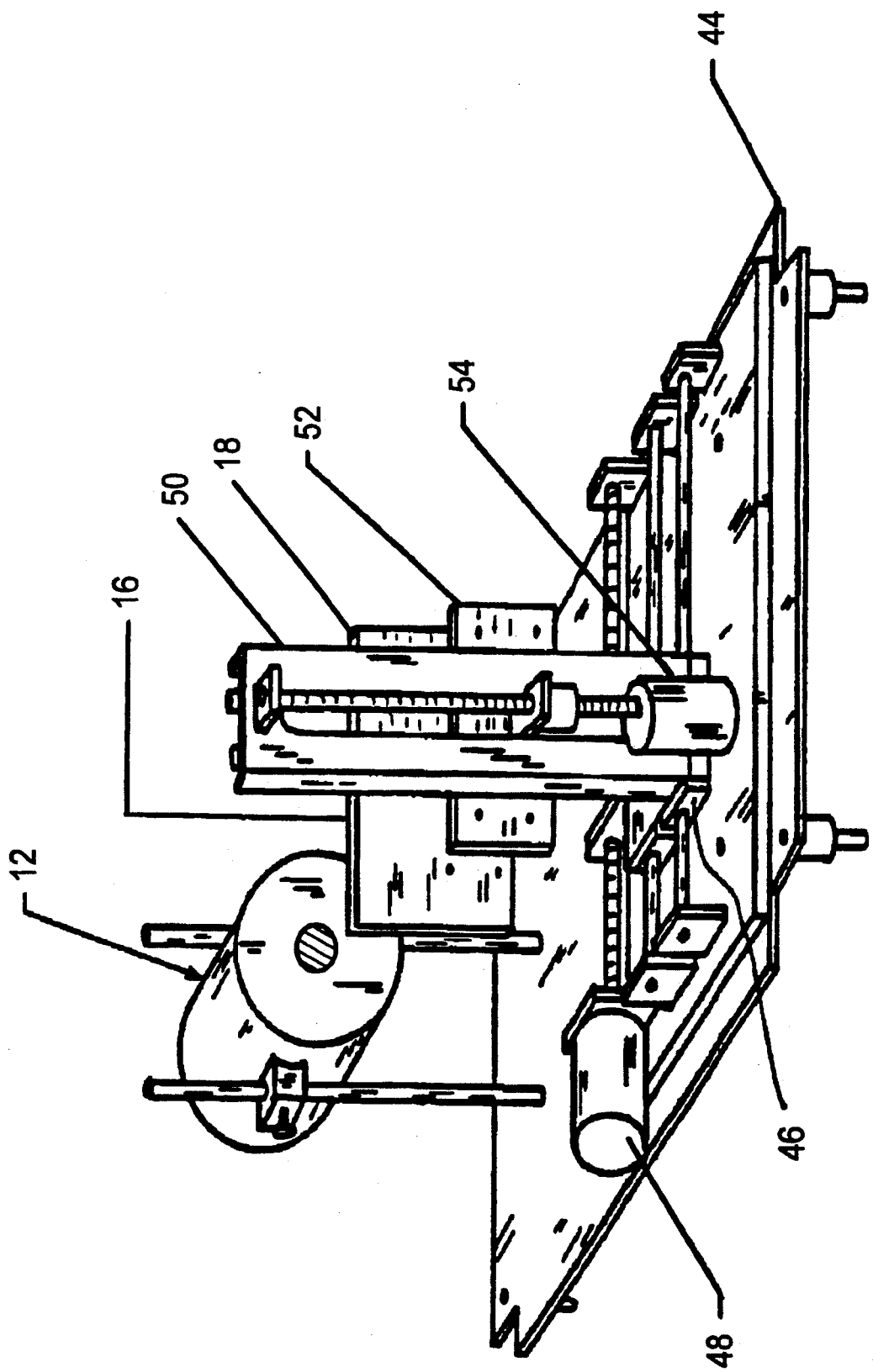
FIG. 3 is a simplified diagrammatic view of a target scanner useful in implementing the method of the present invention.

The target fixture 18 supports the substrate to receive the diamondlike carbon coating and, in the illustrated embodiment, is positioned approximately 8 cm from the ion source assembly 12. Ion density across the ion beam 23 is nonuniform, and in order to obtain a uniform diamondlike carbon coating over the relatively large target substrate, the target fixture 18 functions to move the target substrate in two orthogonal directions in a plane oriented substantially perpendicularly to the ion beam 23. As shown in FIG. 3, the target fixture 18 includes a base plate 44 having thereon mounted a carriage 46 moveable along a horizontal axis and a horizontal stepping drive motor 48 operable to drive the carriage 46 in either direction along the horizontal axis. The carriage 46 includes a vertically extending support 50 and a target plate 52, adapted to support the substrate target, and mounted for bidirectional movement in the vertical direction along the vertical support 50. A vertical stepping drive motor 54 functions to controllably drive the target plate 52 in the up and down directions along the vertical support 50.

Preferably, the horizontal and vertical drive motors 48, 54 each comprise stepping motors. The stepping motors are controlled by SLO-SYN indexers (430-PI, Superior Electric Co.) which are not shown in the figure. The indexers are interfaced to a host IBM XT compatible computer via an RS-232 port, allowing the user to change parameters, such as the feed rate and travel distance. This arrangement permits the target plate 52, and the target substrate thereon mounted, to be controllably scanned in a raster pattern before the ion source assembly 12. A collimater 16 provides a well defined form of the ion beam 23, and the rastering action allows the achievement of a uniform deposition of the diamondlike carbon coating. In the illustrated embodiment, the preferred scanning protocol was determined experimentally, and the optimum conditions for depositing a uniform coating were determined to occur when the target was scanned in the horizontal direction at a rate of substantially 0.04 cm per second and in the vertical direction at a rate of substantially 1.6 cm per second. It has been determined that the rastering feature not only enable coverage of large areas with a uniform coating but also improves the properties of the coating by avoiding overheating of the substrate which can lead to substantial degradation of the coatings at high deposition rates. Preferably the substrate is maintained at a temperature less than about 80° C. Consequently, provided the cooling capacity is adequate the beam fluence can be increased to accelerate the formation of the diamondlike carbon coating without degradation of properties.

The physical properties of the diamondlike carbon coating on various substrates are strongly dependent upon various deposition parameters such as, power level utilized to form the ion beam 23, deposition rate of the coating, hydrogen concentration in the ion beam 23, ion kinetic energy, methane pressure in the ion source assembly 12, composition of the substrate and procedures used for cleaning the substrate prior to deposition of the diamondlike carbon coating. Various preferred operating parameters for use in the method of the present invention are as set forth hereinafter.

Elemental and structural analysis of the diamondlike carbon coatings was done by a combination of conventional Rutherford Back Scattering (RBS) and proton recoil detection(PRD) analysis. RBS was used to determine the quantity of carbon in the coating, whether any impurities were present in the coating and the uniformity of the coating, including evaluation of cracks or pinholes (such as more than 1% of the surface area). PRD was used to determine the hydrogen content of the coatings. The uncertainty of such an analysis was $\pm 5$ atom % and the detector limit was on the order of less than 1 atom %. Typically in ion beam deposited coatings on silicon the carbon atom % was 66.7 to 70.8 with the balance hydrogen and no other detectable impurities.

Effect of Excess Hydrogen in the Ion Source

Hydrogen content in the deposited diamondlike carbon coating has been found to be dependent on the hydrogen-to-methane ratio inside the ion source. In Particular, increased hydrogen concentration in the ion source has been found to result in an increased hydrogen content in the deposited film. Using pure methane in the process of the present invention, the final hydrogen concentration in the diamondlike carbon coating is approximately 30%. With 20% hydrogen in the ion source, the hydrogen concentration in the diamondlike carbon coating is approximately 35% while with hydrogen concentration in the ion source of between 50% and 80%, the final hydrogen concentration in the diamondlike carbon coating is approximately 40% to 41%. Accordingly, variation of the hydrogen concentration in the ion source can be utilized to vary the hydrogen concentration of the deposited diamondlike carbon coating. In general, lower hydrogen concentrations in the diamondlike carbon coating render the coating denser and harder than coatings having higher hydrogen concentrations. Accordingly, in most applications, the use of pure methane is preferred.

Effect of Ion-Kinetic Energy

In accordance with one aspect of the invention, diamondlike carbon coatings having highest quality in terms of uniformity, adhesion, optical properties and freedom from pinholes are obtained when ion kinetic energies between 500 and 1000 eV are used.

Effect of Methane Pressure in the Ion Source

The preferred range of methane pressures in the ion source is between substantially $2.6 \times 10^{-4}$ torr and $6 \times 10^{-5}$ torr. It is believed that at the lower end of the pressure range, hydrogen content in the resulting diamondlike carbon coating is slightly increased. Accordingly, it is believed that harder diamondlike carbon coatings will be obtained at pressures above the lower end of the pressure range.

Effect of Substrate Material

The method is effective to deposit a diamondlike carbon coating on any of the following substrates: silicon, fused silica, Lexan, KG-3 glass, BK-7 glass, zinc sulfide (ZnS) and heavy metal fluoride (HMF).

Effect of Substrate Surface Cleaning Procedures

For substrates formed of BK-7 glass, KG-3 glass, ZnS and silicon, the preferred initial cleaning procedure included: (a) washing with 1, 1, 1 trichloroethane, (b) washing with acetone, (c) washing with methanol and (d) blow drying with dry nitrogen. For Lexan substrates, the preferred cleaning procedure included: (a) washing with methanol and (b) blow drying with dry nitrogen. For substrates comprising HMF or fused silica, a preferred cleaning procedure included: (a) washing with methanol and (b) drying using a heat gun or dry nitrogen.

SAMPLES

Example 1

To verify the effect of excess hydrogen in the ion source, a series of diamondlike coatings were deposited using various ratios of hydrogen to methane within the ion source. All coatings were deposited using the apparatus illustrated in FIGS. 1, 2 and 3 with a beam voltage of 1,000 volts, an accelerator voltage of 100 volts, a filament current of approximately 6 amperes (A), a neutralizer current of approximately 6 A with a 3 ma emission current and a gas flow rate of 1.5 SCCM increasing to 10 SCCM with increasing hydrogen content. The discharge voltage was increased from 58 volts to 98 volts with increasing hydrogen content as necessary to maintain the source discharge.

The composition of each deposited film was determined by Rutherford back scattering (RBS) analysis for carbon content and proton recoil detection (PRD) for the hydrogen content. The various ratios of hydrogen to methane, and the hydrogen-carbon ratios of the resulting films are as set forth in Table 1.

TABLE 1

Effect of Hydrogen in the Source Gas on the Carbon, Hydrogen Contents of Direct Ion Beam Deposited Diamondlike Carbon Films

| % Hydrogen in the Source | % Hydrogen in the Film (± 5%) | % Carbon in the Film (± 5%) |
| --- | --- | --- |
| 0 | 30 | 70 |
| 2 | 40 | 60 |
| 5 | 36 | 64 |
| 10 | 38 | 62 |
| 20 | 35 | 65 |
| 50 | 40 | 60 |
| 80 | 41 | 59 |
| 90 | NO FILM | NO FILM |
| 90 | NO FILM | NO FILM |
| 95 | 39 | 61 |
| 98 | NO FILM | NO FILM |

Example 2

To demonstrate the effect of ion kinetic energy on the resulting diamondlike carbon coating, two coatings were deposited at ion kinetic energies of 500 and 1,000 eV respectively. These coatings were deposited using pure methane gas at a flow rate of 3 SCCM and a chamber pressure of $9.0 \times 10^{-5}$ torr. The hydrogen-carbon ratio of the resulting coatings, and the film growth rate in angstroms per minute, are as set forth in Table 2.

TABLE 2

Effect of Ion Impact Energy on the Direct Ion Beam Deposited Diamondlike Carbon Films

| Sample No. | Ion Impact Energy (eV) | % Hydrogen in the Film (± 5%) | % Carbon in the Film (± 5%) | Film Growth Rate A/min ± 5 A/min |
| --- | --- | --- | --- | --- |
| 1 | 1000 | 33.0 | 67.0 | 23 |
| 2 | 500 | 37.5 | 63.5 | 25 |

Example 3

The effect of methane pressure in the ion source was demonstrated by depositing diamondlike carbon coatings on a silicon substrate using pure methane gas and an ion kinetic energy of 1,000 eV. The methane pressures and flow rates, as well as the hydrogen-carbon ratios of the resulting coatings, are as shown in Table 3.

TABLE 3

Effect of Methane Pressure on the Direct Ion-Beam Deposited Diamondlike Carbon Films

| Sample No. | CH4 Source Pressure (torr) | Flow Rate (SCCM) | % Hydrogen in the Film (± 5%) | % Carbon in the Film (± 5%) |
| --- | --- | --- | --- | --- |
| 1 | $6 \times 10^{-5}$ | 1.32 | 38.4 | 61.6 |
| 2 | $9 \times 10^{-5}$ | 3.0 | 33 | 67 |
| 3 | $2.6 \times 10^{-4}$ | 7.32 | 33.4 | 66.7 |

Example 4

Diamondlike carbon coatings were formed on various substrates using pure methane at a flow rate of 3.0 SCCM, an ion kinetic energy of 1,000 eV, a source pressure of $9 \times 10^{-5}$ torr and deposition times ranging from 65 to 450 minutes. The diamondlike carbon coatings were deposited on the various substrates over an area of approximately 306 square cm using the target scanner shown in FIG. 3, and additional deposits were made on each substrate over an area of substantially 4.9 square cm with no scanning using the direct 2.5 cm diameter ion beam. The substrates and the resulting deposition rates for both the scanned coatings and the directly deposited coatings are as set forth in Table 4.

In the following Examples 5-11, various cleaning procedures were utilized in conjunction with various substrates prior to ion deposition of the diamondlike carbon coatings. In the Examples 5-11 that follow, the cleaning procedures are identified in accordance with the following key:

a = washing with 1, 1, 1 tricloroethane followed by washing in acetone, followed by washing in methanol followed by nitrogen drying.

b = washing in 1, 1, 1 tricloroethane followed by washing in methanol, followed by nitrogen drying.

c = washing in methanol followed by heat drying.

d = soaking in hexane, lightly swabbed, followed by nitrogen drying.

e = washing in ethanol, lightly swabbed, followed by heat drying.

TABLE 4

Diamondlike Carbon Film Growth Rate on Various Substrates

| Substrate | Deposition Rate (Å/min) | Direct ion beam Deposition Rate (Å/sec) |
|---|---|---|
| Lexan | 11 | 11.5 |
| BK-7 | 8 | 8.3 |
| KG-3 | 8 | 8.3 |
| Silicon | 6 | 6.3 |
| Fused Silica, Glass | 5.5 | 5.7 |
| ZnS, ZnSe | 6.5 | 6.8 |
| HMF | 6.5 | 6.8 |

Example 5

Ten samples of diamondlike carbon coatings on ZnS were prepared in accordance with the operating parameters and cleaning procedures set forth in Table 5. The characteristics of the resulting coatings were as provided in the "comments" set forth for each sample.

TABLE 5

SUBSTRATE: ZnS
Gas: 99.99% Methane   Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 1/900 | 240 | 1.0E-4 | 1000 | 12 | 100 | 70 | 6.0 | a |
| | | | | | | | | |
| Excellent film (some scratches on substrate) (brown color; masked) |||||||||
| 2/900 | 240 | 1.0E-4 | 1000 | 12 | 100 | 70 | 6.0 | a |
| Excellent film (some scratches on substrate) (brown color) |||||||||
| 3/900 | 240 | 1.0E-4 | 1000 | 12 | 100 | 70 | 6.0 | a |
| Excellent film (some scratches on substrate) (brown color) |||||||||
| 4/900 | 240 | 1.0E-4 | 1000 | 12 | 100 | 70 | 6.0 | a |
| Excellent film (some scratches on substrate) (brown color) |||||||||
| 5/3413 | 450 | 1.6E-4 | 1000 | 10 | 100 | 69 | 5.8 | c |
| Film blistered on edges after approx. 2 wks. (dark brown color) |||||||||
| 6/2911 | 600 | 9.2E-5 | 1000 | 11 | 100 | 70 | 6.1 | c |
| Film blistered on one side after approx. 2 wks) (brown color) |||||||||
| 7/4513 | 600 | 9.6E-5 | 1000 | 10.5 | 100 | 70 | 6.1 | c |
| film blistered after approx. 2 weeks (dark brown color; masked) |||||||||
| 8/2056 | 300 | 6.2E-5 | 1000 | 11 | 100 | 70 | 6.2 | e |
| Excellent film (one scratch on substrate) (brown color; masked) |||||||||
| 9/2056 | 300 | 6.2E-5 | 1000 | 11 | 100 | 70 | 6.2 | e |
| Excellent film (brown color) (masked) (thick substrate) |||||||||
| 10/2056 | 300 | 6.2E-5 | 1000 | 11 | 100 | 70 | 6.2 | e |
| Excellent film (brown color) |||||||||

Example 6

Ten samples of diamondlike carbon coatings on silicon substrates were prepared in accordance with the operating parameters and cleaning procedures set forth in Table 6. The characteristics of the resulting films were as set forth in the "comments" following each sample.

TABLE 6

SUBSTRATE: SILICON
Gas: 99.99% Methane   Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 1/1400 | 240 | 1.7E-4 | 1000 | 9.5 | 100 | 70 | 6.2 | a |
| Excellent film (gold color) (masked region + partial masking) |||||||||
| 2/1400 | 240 | 1.7E-4 | 1000 | 9.5 | 100 | 70 | 6.2 | a |
| Excellent film (gold color) (small masked region) |||||||||
| 3/1400 | 240 | 1.7E-4 | 1000 | 9.5 | 100 | 70 | 6.2 | a |
| Excellent film (gold color) |||||||||
| 4/1400 | 240 | 1.7E-4 | 1000 | 9.5 | 100 | 70 | 6.2 | a |
| Excellent film (gold color) |||||||||
| 5/4746 | 600 | 9.6E-5 | 1000 | 10.5 | 100 | 70 | 6.1 | c |
| Excellent film (greenish dark silver color) (masked) |||||||||
| 6/4746 | 600 | 9.6E-5 | 1000 | 10.5 | 100 | 70 | 6.1 | c |
| Excellent film (greenish dark silver color) |||||||||
| 7/5334 | 600 | 8.0E-5 | 1000 | 11 | 100 | 70 | 6.1 | c |
| Excellent film (greenish color) (masked) |||||||||
| 8/5334 | 600 | 8.0E-5 | 1000 | 11 | 100 | 70 | 6.1 | c |
| Excellent film (greenish color, fringed on two edges) |||||||||
| 9/5334 | 600 | 8.0E-5 | 1000 | 11 | 100 | 70 | 6.1 | c |
| Excellent film (greenish color, fringed in two areas) |||||||||
| 10/5334 | 600 | 8.0E-5 | 1000 | 11 | 100 | 70 | 6.1 | c |
| Excellent film (greenish color, fringed on one edge) |||||||||

Example 7

Ten samples of diamondlike carbon coatings on Lexan substrates were prepared in accordance with the operating parameters and cleaning procedures set forth in Table 7. The characteristics of the resulting films were as set forth in the "comments" following each sample.

TABLE 7

SUBSTRATE: LEXAN

Gas: 99.99% Methane  Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 1/2455 | 120 | 1.2E-4 | 1000 | 10 | 100 | 72 | 6.0 | b |
| Excellent film (gold color) (masked) | | | | | | | | |
| 2/2455 | 120 | 1.2E-4 | 1000 | 10 | 100 | 72 | 6.0 | b |
| Excellent film (one scratch across surface) (gold color) | | | | | | | | |
| 3/2455 | 120 | 1.2E-4 | 1000 | 10 | 100 | 72 | 6.0 | b |
| Excellent film (gold color) | | | | | | | | |
| 4/2455 | 120 | 1.2E-4 | 1000 | 10 | 100 | 72 | 6.0 | b |
| Excellent film (gold color) | | | | | | | | |
| 5/2300 | 120 | 7.0E-5 | 1000 | 11 | 100 | 70 | 5.9 | b |
| Excellent film (gold color) | | | | | | | | |
| 6/2300 | 120 | 7.0E-5 | 1000 | 11 | 100 | 70 | 5.9 | b |
| Excellent film (one scratch about 8 mm long) (gold color) | | | | | | | | |
| 7/2300 | 120 | 7.0E-5 | 1000 | 11 | 100 | 70 | 5.9 | b |
| Excellent film (gold color) | | | | | | | | |
| 8/2300 | 120 | 7.0E-5 | 1000 | 11 | 100 | 70 | 5.9 | b |
| Excellent film (one pinhole from substrate) (gold color) | | | | | | | | |
| 9/1800 | 120 | 9.6E-5 | 1000 | 10 | 100 | 70 | 5.9 | b |
| Excellent film (gold color) | | | | | | | | |
| 10/1800 | 120 | 9.6E-5 | 1000 | 10 | 100 | 70 | 5.9 | b |
| Excellent film (gold color) | | | | | | | | |

Example 8

Ten samples of diamondlike carbon coatings on KG-3 glass substrates were prepared in accordance with the operating parameters and cleaning procedures set forth in Table 8. The characteristics of the resulting films were as set forth in the "comments" following each sample.

Example 9

Ten samples of diamondlike carbon coatings on HMF substrates were prepared in accordance with the operating parameters and cleaning procedures set forth in Table 9. The characteristics of the resulting films were as set forth in the "comments" following each sample.

TABLE 8

SUBSTRATE: KG-3

Gas: 99.99% Methane  Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 1/982 | 150 | 1.6E-4 | 1000 | 10 | 100 | 69 | 6.0 | a |
| Excellent film (gold color) (masked) | | | | | | | | |
| 2/982 | 1500 | 1.6E-4 | 1000 | 10 | 100 | 69 | 6.0 | a |
| Some pinholes in one corner (gold color film) | | | | | | | | |
| 3/982 | 150 | 1.6E-4 | 1000 | 10 | 100 | 69 | 6.0 | a |
| Some staining and holes in one corner (gold color film) | | | | | | | | |
| 4/982 | 150 | 1.6E-4 | 1000 | 10 | 100 | 69 | 6.0 | c |
| Some staining and clouding of film in one corner (gold color) | | | | | | | | |
| 5/1435 | 150 | 1.6E-4 | 1000 | 10 | 100 | 69 | 6.0 | c |
| Excellent film (gold color) | | | | | | | | |
| 6/1435 | 150 | 1.6E-4 | 1000 | 10 | 100 | 69 | 6.0 | c |
| Excellent film (gold color) | | | | | | | | |
| 7/1435 | 150 | 1.6E-4 | 1000 | 10 | 100 | 69 | 6.0 | c |
| Excellent film (gold color) | | | | | | | | |
| 8/220 | 150 | 8.0E-5 | 1000 | 10.5 | 100 | 70 | 6.0 | c |
| Excellent film (gold tint) | | | | | | | | |
| 9/220 | 150 | 8.0E-5 | 1000 | 10.5 | 100 | 70 | 6.0 | c |
| Excellent film (gold tint) | | | | | | | | |
| 10/220 | 150 | 8.0E-5 | 1000 | 10.5 | 100 | 70 | 6.0 | c |
| Excellent film (gold tint) | | | | | | | | |

TABLE 9

SUBSTRATE: HMF

Gas: 99.99% Methane  Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 1/1750 | 240 | 7.0E-5 | 1000 | 10 | 100 | 70 | 6.2 | e |
| Excellent film (some holes) (brown color) (masked) | | | | | | | | |
| 2/1750 | 240 | 7.0E-5 | 1000 | 10 | 100 | 70 | 6.2 | e |
| Uniform film (some defects) (brown color) | | | | | | | | |
| 3/1750 | 240 | 7.0E-5 | 1000 | 10 | 100 | 70 | 6.2 | e |
| Excellent film (brown color) | | | | | | | | |

TABLE 9-continued

SUBSTRATE: HMF

Gas: 99.99% Methane    Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 4/1750 | 240 | 7.0E-5 | 1000 | 10 | 100 | 70 | 6.2 | e |
| | | | Excellent film (brown color) | | | | | |
| 5/1750 | 240 | 7.0E-5 | 1000 | 10 | 100 | 70 | 6.2 | e |
| | | | Excellent film (brown color) | | | | | |
| 6/1750 | 240 | 7.0E-5 | 1000 | 10 | 100 | 70 | 6.2 | e |
| | | Excellent film (small chip in substrate) (brown color) | | | | | | |
| 7/900 | 150 | 6.6E-5 | 1000 | 11 | 100 | 70 | 5.9 | e |
| | | Uniform film (substrate scratched) (brown tint) | | | | | | |
| 8/900 | 150 | 6.6E-5 | 1000 | 11 | 100 | 70 | 5.9 | e |
| | | Film thinned in area approx. 4 mm in dia. (brown tint) | | | | | | |
| 9/900 | 150 | 6.6E-5 | 1000 | 11 | 100 | 70 | 5.9 | e |
| | | Uniform film (substrate scratched) (brown tint) | | | | | | |
| 10/900 | 150 | 6.6E-5 | 1000 | 11 | 100 | 70 | 5.9 | e |
| | | Uniform film (defect in substrate) (brown tint) | | | | | | |

Ten samples of diamondlike carbon coatings on BK-7 glass substrates were prepared in accordance with the operating parameters and cleaning procedures set forth in Table 10. The characteristics of the resulting films were as set forth in the "comments" following each sample.

TABLE 10

SUBSTRATE: BK-7

Gas: 99.99% Methane    Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 1/276 | 100 | 1.2E-4 | 1000 | 10 | 100 | 70 | 6.0 | c |
| | | Excellent film (brown tint) | | | | | | |
| 2/276 | 100 | 1.2E-4 | 1000 | 10 | 100 | 70 | 6.0 | c |
| | | Excellent film (brown tint) (masked) | | | | | | |
| 3/276 | 100 | 1.2E-4 | 1000 | 10 | 100 | 70 | 6.0 | c |
| | | Excellent film (brown tint) | | | | | | |
| 4/276 | 100 | 1.2E-4 | 1000 | 10 | 100 | 70 | 6.0 | c |
| | | Excellent film (brown tint) | | | | | | |
| 5/274 | 100 | 8.4E-5 | 1000 | 9.5 | 100 | 70 | 5.9 | c |
| | | Some pinholes in film | | | | | | |
| 6/274 | 100 | 8.4E-5 | 1000 | 9.5 | 100 | 70 | 5.9 | c |
| | | Several pinholes and some staining | | | | | | |
| 7/645 | 100 | 9.0E-5 | 1000 | 9.5 | 100 | 69 | 6.0 | c |
| | | Excellent film (gold color) | | | | | | |
| 8/645 | 100 | 9.0E-5 | 1000 | 9.5 | 100 | 69 | 6.0 | c |
| | | Excellent film (gold color) | | | | | | |
| 9/645 | 100 | 9.0E-5 | 1000 | 9.5 | 100 | 69 | 6.0 | c |
| | | Excellent film (gold color) | | | | | | |
| 10/645 | 100 | 9.0E-5 | 1000 | 9.5 | 100 | 69 | 6.0 | c |
| | | Excellent film (gold color) | | | | | | |

Example 11

Ten samples of diamondlike carbon coatings on fused silica substrates were prepared in accordance with the operating parameters and cleaning procedures set forth in Table 11. The characteristics of the resulting films were as set forth in the "comments" following each sample.

TABLE 11

SUBSTRATE: FUSED SILICA

Gas: 99.99% Methane    Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 1/987 | 185 | 1.6E-4 | 1000 | 10 | 100 | 69 | 6.0 | c |
| | | Excellent film (gold color) (masked) | | | | | | |
| 2/987 | 185 | 1.6E-4 | 1000 | 10 | 100 | 69 | 6.0 | c |
| | | Excellent film (gold color) | | | | | | |
| 3/987 | 185 | 1.6E-4 | 1000 | 10 | 100 | 69 | 6.0 | c |
| | | Excellent film (gold color) | | | | | | |
| 4/1011 | 185 | 9.8E-5 | 1000 | 10 | 100 | 70 | 5.9 | c |
| | | Excellent film (one defect approx. 1 mm in dia: gold color; masked) | | | | | | |
| 5/1011 | 185 | 9.8E-5 | 1000 | 10 | 100 | 70 | 5.9 | c |
| | | Excellent film (small fine scratch in center) (gold color) | | | | | | |
| 6/1011 | 185 | 9.8E-5 | 1000 | 10 | 100 | 70 | 5.9 | c |
| | | Excellent film (one defect approx. 1 mm in dia.) (gold color) | | | | | | |

TABLE 11-continued

SUBSTRATE: FUSED SILICA

Gas: 99.99% Methane  Gas rate: 3.25 SCCM

| sample # Film Thickness (Å) | dep. time (min) | chamber press. (Torr) | beam voltage (volts) | beam current (mA) | accel. voltage (volts) | discharge voltage (volts) | cathode current (amps) | cleaning proc. (see *) |
|---|---|---|---|---|---|---|---|---|
| 7/1011 | 185 | 9.8E-5 | 1000 | 10 | 100 | 70 | 5.9 | c |
| | | | Excellent film (gold color) | | | | | |
| 8/801 | 185 | 9.4E-5 | 1000 | 10 | 100 | 70 | 5.8 | c |
| | | | Excellent film (gold color) | | | | | |
| 9/801 | 185 | 9.4E-5 | 1000 | 10 | 100 | 70 | 5.8 | c |
| | | | Excellent film (gold color) | | | | | |
| 10/801 | 185 | 9.4E-5 | 1000 | 10 | 100 | 70 | 5.8 | c |
| | | | Excellent film (gold color) | | | | | |

Example 12

Environmental effects upon diamondlike carbon coatings was tested by using various standard mechanical, chemical and thermal tests on the coatings. In particular, tests were carried out on coatings on BK-7 glass, KG-3 glass, ZnS, silicon, lexan and heavy metal fluorides (HMF) and fused silica. The tests were performed in accordance with the known U.S. military specifications, MIL-C-48497A. A new sample was used for each test and the Scotch adhesion test was performed before and after organic solvent, mineral acid attack, humidity and temperature cycling tests. These tests were done by dipping the entire sample in the solution. The crack and partial removal of diamondlike carbon film was observed due to the attack of these chemicals on the bare substrate. The coatings were examined by optical microscope before and after the test. Results of these tests are shown in Tables 12-15 below.

TABLE 12

Organic Solvent, Scotch Tape/Adhesion and Rubber Wear/Adhesion Tests on Ion-Assisted Deposited Diamondlike Carbon on Various Substrates

| Substrate | Scotch Tape | 1,1,1 Tri-Chloroethane | Acetone | Methanol | Scotch Tape | Rubber Wear Test |
|---|---|---|---|---|---|---|
| BK-7 | NE | NE | NE | NE | NE | NE |
| KG-3 | NE | NE | NE | NE | NE | NE |
| ZnS | NE | NE | NE | NE | NE | NE |
| Silicon | NE | NE | NE | NE | NE | NE |
| Lexan | NE | C | C | NE | NE | PS |
| HMF | NE | NE | NE | NE | NE | S |
| Fused Silica | NE | NE | NE | NE | NE | NE |

NE: No Effect
PR: Partial Removal
TR: Total Removal
S: Scratched
PS: Partial Scratched
B: Blistered
C: Cracked

TABLE 13

Mineral Acid Attack, Scotch Tape/Adhesion Tests on Ion-Assisted Deposited Diamondlike Carbon on Various Substrates

| Substrate | Sulfuric Acid | Nitric Acid | Hydrochloric Acid | Hydrofluoric Acid | Scotch Tape |
|---|---|---|---|---|---|
| BK-7 | NE | NE | NE | B | NE |
| KG-3 | NE | NE | NE | B | NE |
| ZnS | NE | B | B | NE | PR |
| Silicon | NE | NE | NE | NE | NE |
| Lexan | B | C | NE | NE | NE |
| HMF | NE | TR | B | NE | PR |
| Fused Silica | NE | NE | NE | NE | NE |

TABLE 14

Humidity Test for Three Hours Over Boiling Water on Ion-Assisted Deposited DLC on Various Substrates

| Substrate | After 3 hrs Exposure | Scotch Tape |
|---|---|---|
| BK-7 | NE | NE |
| KG-3 | NE | NE |
| ZnS | NE | NE |
| Silicon | NE | NE |
| Lexan | NE | NE |
| HMF | NE | PR |
| Fused Silica | NE | NE |

TABLE 15

Low Temperature Test in Liquid Nitrogen and Subsequent in High Temperature for Two Hours and Followed Scotch Tape Adhesion Tests on Ion-Assisted Deposited Diamondlike Carbon on Various Substrates

| Substrate | After 2 hrs in Ln2 | Room Temperature | After 2 hrs at 98° C. | Scotch Tape |
|---|---|---|---|---|
| BK-7 | NE | NE | NE | NE |
| KG-3 | NE | NE | NE | NE |
| ZnS | NE | NE | NE | NE |
| Silicon | NE | NE | NE | NE |
| Lexan | NE | NE | NE | NE |
| HMF | NE | NE | B | NE |
| Fused Silica | NE | NE | NE | NE |

Figure 4:
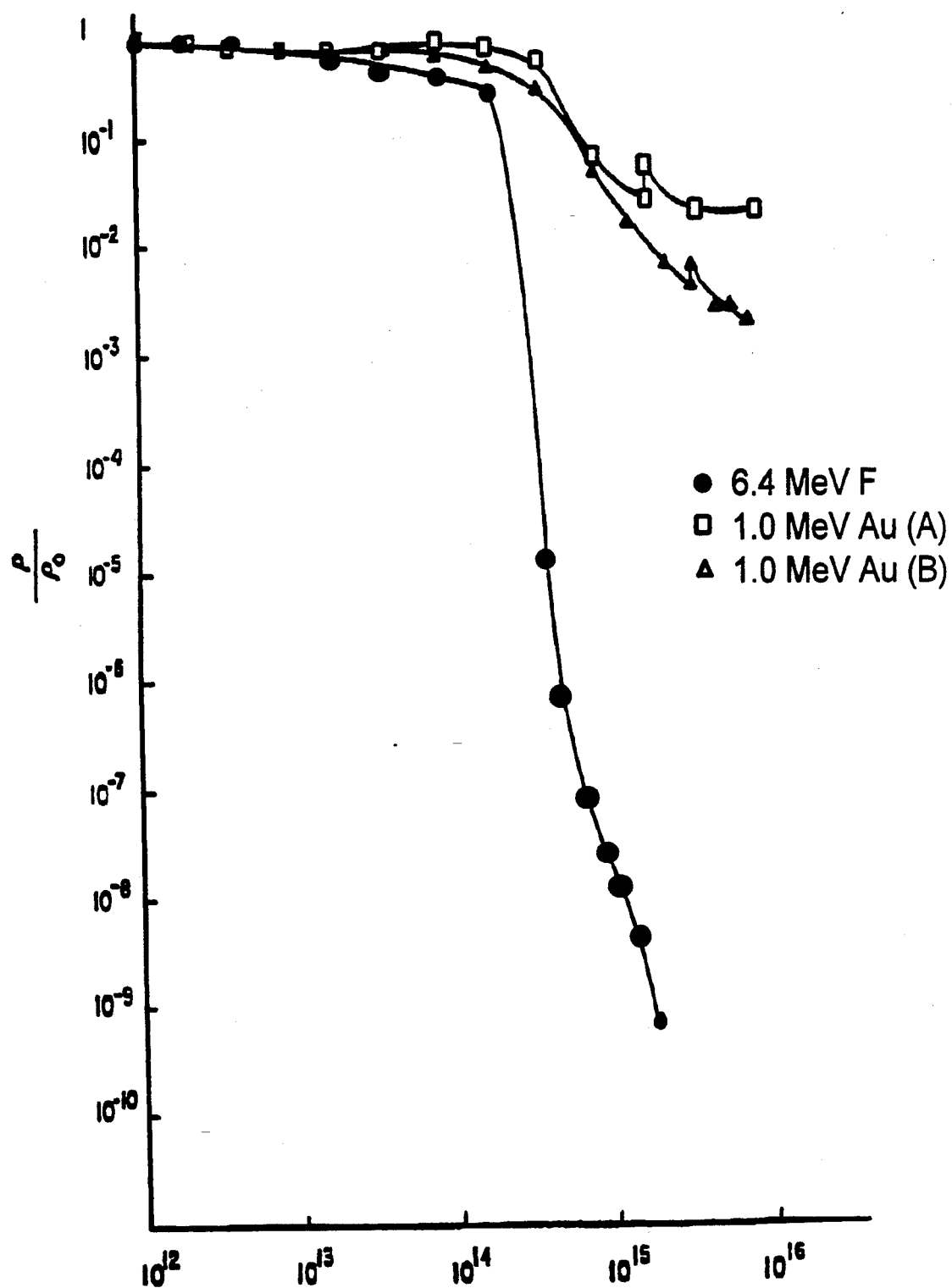
FIG. 4 is the change in resistivity of a diamondlike carbon coating as a function of ion bombardment.
Figure 5A:
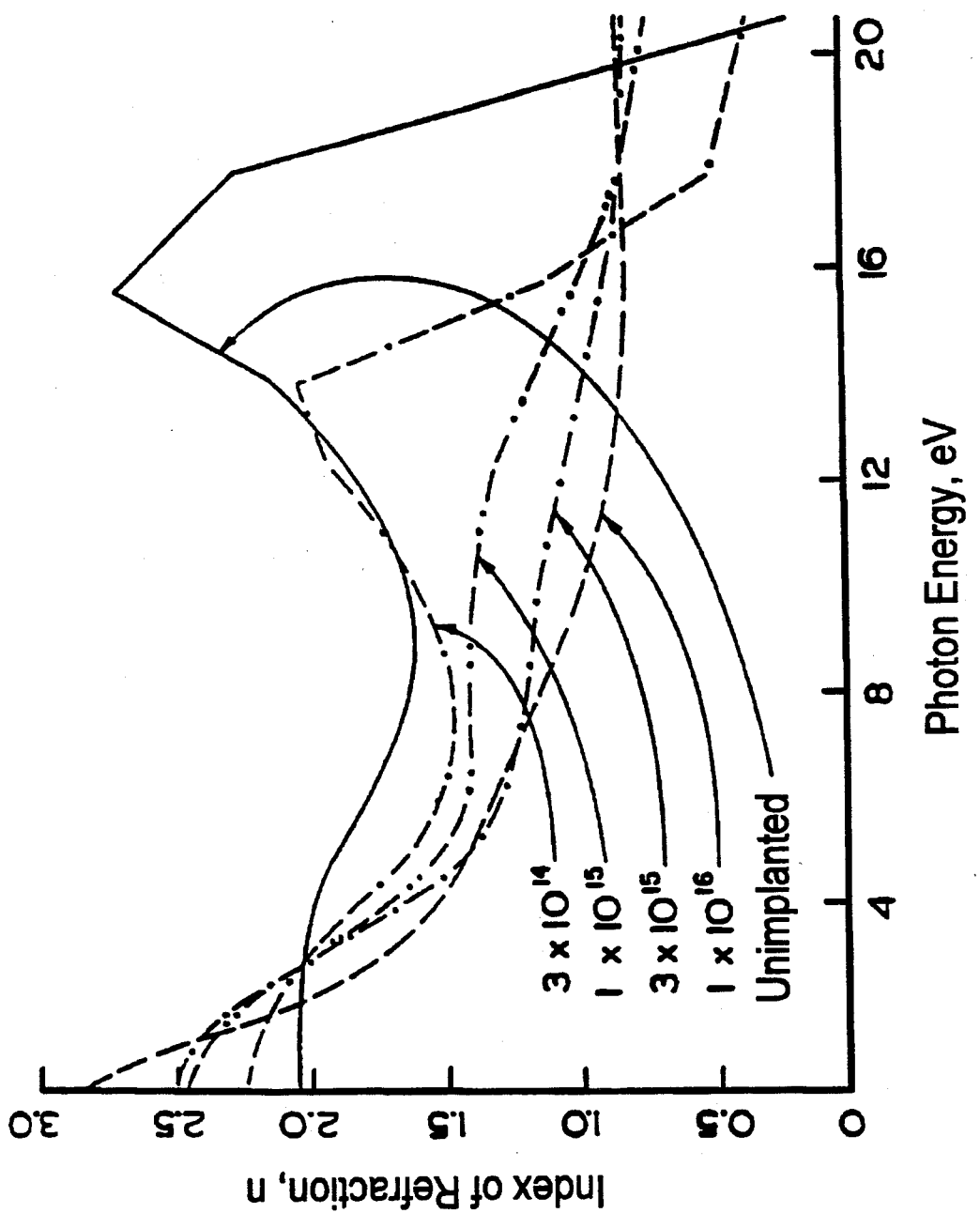
FIG. 5a is the behavior of the index of refraction for a fluorine implanted coating.
Figure 5B:
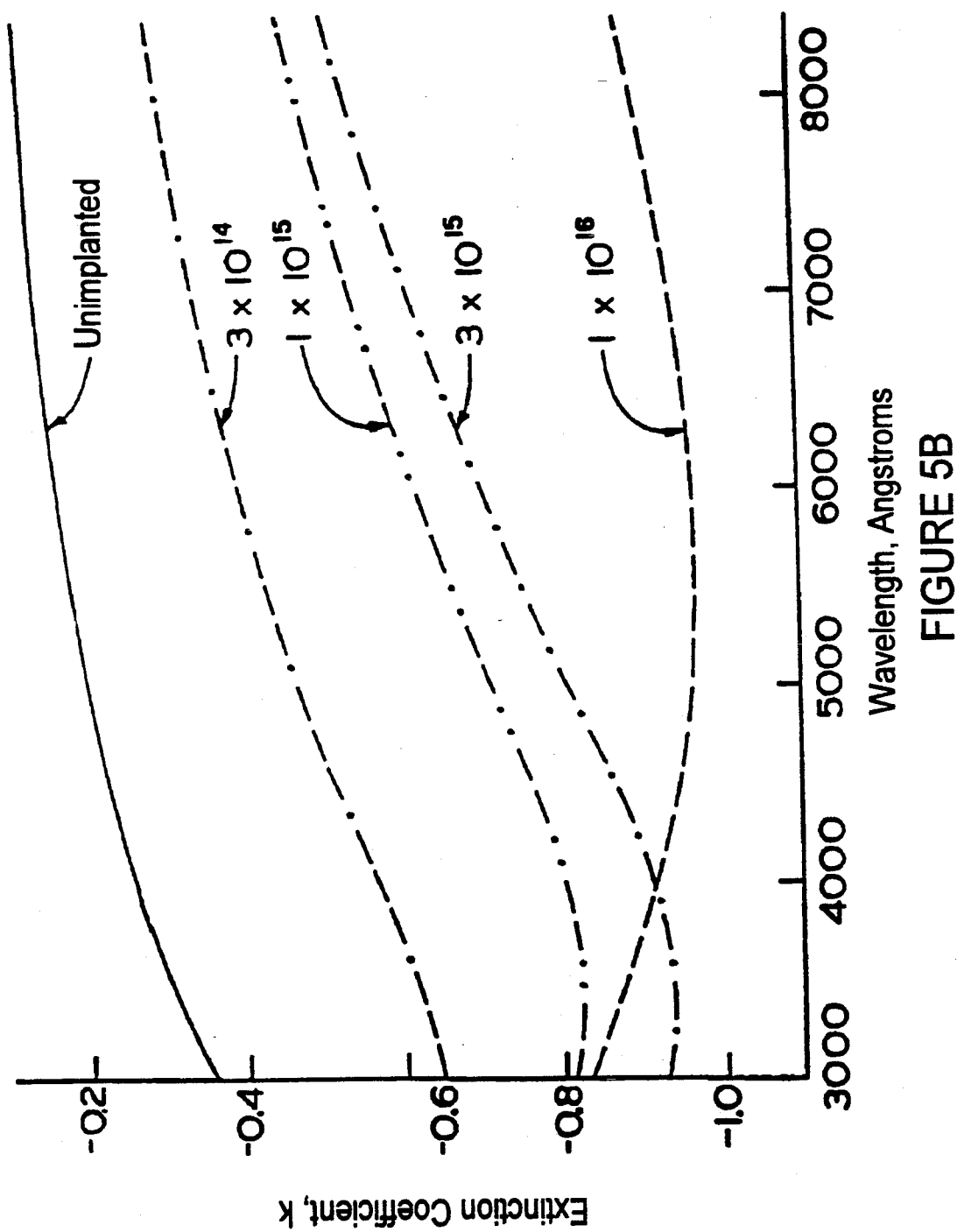
FIG. 5b is the optical coefficient as a function of fluorine ion implantation and FIG. 5c is the behavior of the optical energy gap for a fluorine implanted coating.
Figure 5C:
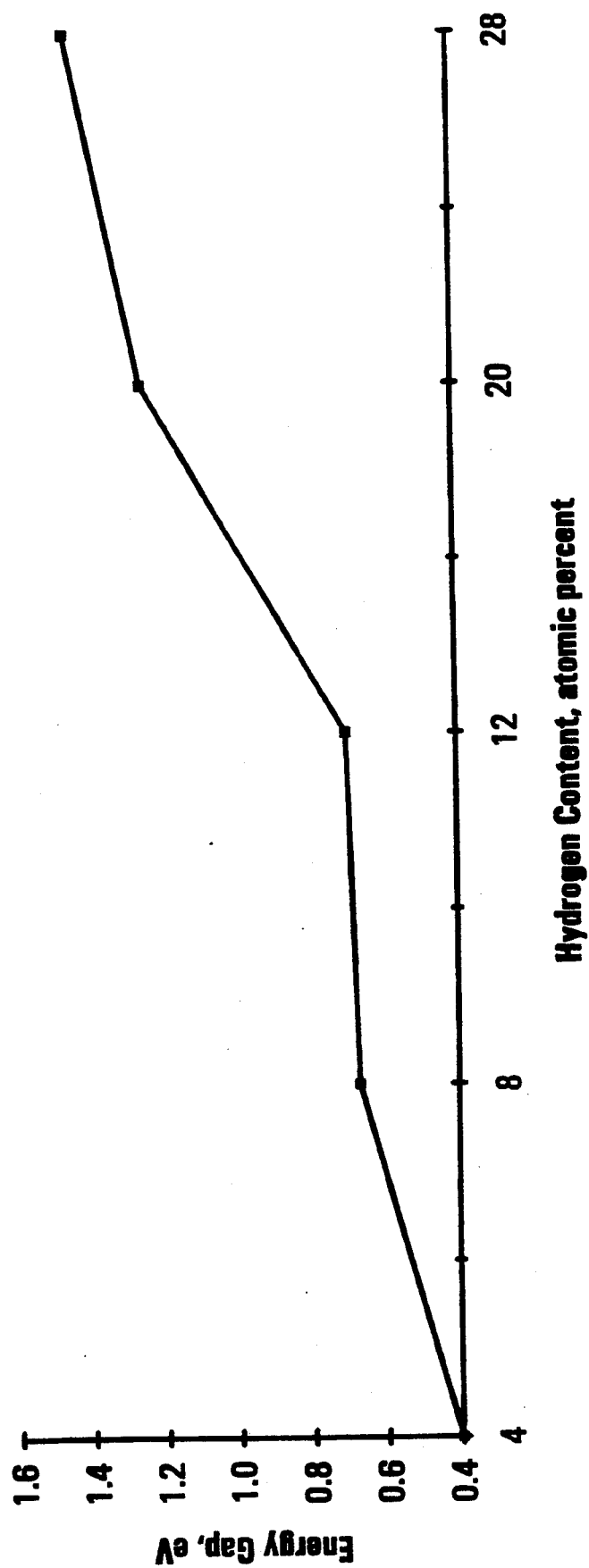

The effect of high energy ion irradiation on diamondlike carbon coatings was carried out to determine the durability of the coatings in adverse environments having high energy particles present. The subject diamondlike carbon coating was deposited on a silicon substrate. Irradiation of the coating was performed with 1 MeV $Au^+$ and 6.4 MeV $F^+$ using a 1.7 —MV General Ionex 4117A Tandetron. The effect of carbon nd hydrogen content, resistivity and optical properties of the diamondlike carbon coating were studies as a function of ion flux, ranging from $2 \times 10^{14}/cm^2$ to $10^{16}/cm^2$. Both RBS and PRD techniques were used to determine the carbon and hydrogen content and the presence of any impurities. Optical analysis was performed by variable angle spectroscopic ellipsometry (VASE) assuming the applicability of the Lorentz Oscillator Model. The resistivity was measured by a Keithley 610C electrometer according to the conventional method of Prana et al., J. Appl. Phys. 61, 2519 (1987). Tables 16–19 illustrate the effect of irradiation upon hydrogen and carbon content of the coating. The carbon content did not undergo any apparent change while the hydrogen content decreased with increasing ion fluence. FIGS. 4 and 5 illustrate the change of resistivity and optical properties with ion fluence. The fluorine ion was more effective than gold ion bombardment in reducing resistivity. The primary change in optical properties arises from a less of hydrogen causing a decrease in the optical energy gap.

TABLE 16

Hydrogen and Carbon Content of Unirradiated Portions of the DLC Samples Irradiated with 6.4 MeV Fluorine Ions

| Sample No. | Hydrogen atoms·cm$^{-2}$ | Carbon atoms·cm$^{-2}$ | % H | % C |
|---|---|---|---|---|
| 023/4 | 3.18E + 17 | 7.65E + 17 | 29.4% | 70.6% |
| 024 | 2.42E + 17 | 5.88E + 17 | 29.2% | 70.8% |
| 023/2 | 2.66E + 17 | 6.18E + 17 | 30.1% | 69.9% |
| 016/1 | 6.20E + 17 | 1.55E + 18 | 28.6% | 71.4% |

TABLE 17

Variation of Carbon and Hydrogen Content of DLC Films Irradiated with 6.4 MeV Fluorine Ions to Various Fluences

| Sample No. | Fluence ions·cm$^{-2}$ | Hydrogen atoms·cm$^{-2}$ | Carbon atoms·cm$^{-2}$ | % H | % C | % H Lost |
|---|---|---|---|---|---|---|
| 023/4 | 3.0E + 14 | 1.81E + 17 | 6.98E + 17 | 20.6% | 79.4% | 37.6% |
| 024 | 1.0E + 15 | 8.43E + 16 | 6.29E + 17 | 11.8% | 88.2% | 67.4% |
| 023/2 | 3.0E + 15 | 6.00E + 16 | 7.33E + 17 | 7.6% | 92.4% | 81.0% |
| 016/1 | 1.0E + 16 | 9.56E + 16 | 1.44E + 17 | 6.4% | 93.6% | 83.0% |

TABLE 18

Hydrogen and Carbon Content of Unirradiated Portions of the DLC Samples Irradiated with 1.0 MeV Gold Ions

| Sample No. | Hydrogen atoms·cm$^{-2}$ | Carbon atoms·cm$^{-2}$ | % H | % C |
|---|---|---|---|---|
| 017 | 5.85E + 17 | 1.35E + 18 | 30.3% | 69.7% |
| 026 | 3.32E + 17 | 7.42E + 17 | 30.9% | 69.1% |
| 021 | 2.97E + 17 | 6.69E + 17 | 30.7% | 69.3% |
| 016/4 | 5.08E + 17 | 1.14E + 18 | 30.8% | 69.2% |

TABLE 19

Variation of Carbon and Hydrogen Content of DLC Films Irradiated with 1.0 MeV Gold Ions to Various Fluences

| Sample No. | Fluence ions·cm$^{-2}$ | Hydrogen atoms·cm$^{-2}$ | Carbon atoms·cm$^{-2}$ | % H | % C | % H Lost |
|---|---|---|---|---|---|---|
| 017 | 3.0E + 14 | 5.44E + 17 | 1.38E + 18 | 28.3% | 71.7% | 9.5% |
| 026 | 1.0E + 15 | 2.30E + 17 | 7.78E + 17 | 22.8% | 77.2% | 33.9% |
| 021 | 3.0E + 15 | 1.83E + 17 | 7.22E + 17 | 20.2% | 79.8% | 42.9% |
| 016/1 | 1.0E + 16 | 2.51E + 17 | 1.06E + 18 | 19.2% | 80.8% | 46.9% |

While a particular embodiment of the invention has been shown and described, it will be obvious of those skilled in the art that changes and modifications may be made without departing from the invention in its broader aspects, and, therefore, the aim in the appended claims is to cover all such changes and modifications as fall within the true spirit and scope of the invention.

We claim:

1. A method of forming a diamondlike carbon coating on a substrate comprising the steps of:
   generating a carbon containing ionized beam having an ion kinetic energy in the range of substantially 500 to 1,000 eV; and
   impinging said ionized beam onto the substrate.

2. A method as defined in claim 1 wherein said carbon containing ionized beam includes a hydrocarbon.

3. A method as defined in claim 2 wherein said hydrocarbon consists essentially of methane.

4. A method as defined in claim 1 wherein said ionized beam consists essentially of ionized methane and hydrogen.

5. A method as defined in claim 4 wherein said method is utilized within a vacuum chamber having an ambient background pressure of $10^{-6}$ torr and wherein the operating pressure within said vacuum chamber during formation of the coating on the substrate is in the range of substantially $10^{-5}$ to $10^{-4}$ torr.

6. A method of forming a diamondlike carbon coating on a substrate comprising the steps of:
   generating a carbon containing ionized beam having an ion kinetic energy in the range of 500 to 1,000 eV;
   impinging said ionized beam onto said substrate to form said diamondlike carbon coating on said substrate; and
   scanning said ion beam relative to said substrate to uniformly form said diamondlike carbon coating on said substrate.

7. A method as defined in claim 6 wherein said scanning step maintains said substrate below about 80° C.

8. The method as defined in claim 6 wherein said ionized beam is comprised of decomposed methane molecules.

9. The method as defined in claim 8 wherein a methane gas pressure in the ionization chamber is between about $2.6 \times 10^{-4}$ and $6 \times 10^{-5}$ torr.

10. The method as defined in claim 6 wherein said substrate is selected from the group consisting essentially of silicon, fused silica, Lexan, KG-3 glass, BK-7 glass, zinc sulfide and heavy metal fluorides.

11. The method as defined in claim 6 wherein said diamondlike carbon coating includes less than about 40% hydrogen and less than about 80% hydrogen is present in the ionization chamber.

12. A method of forming a diamondlike carbon coating on a substrate selected from the group consisting of ZnS and ZnSe, comprising the steps of:
generating a carbon containing ionized beam having an ion kinetic energy in the range of about 500 to 1,000 eV; and
impinging said ionized beam onto said substrate selected from said group consisting of ZnS and ZnSe to form said diamondlike carbon coating on said substrate.

13. A method of forming a diamondlike carbon coating on a substrate comprising the steps of:
generating a carbon containing ionized beam having an ion kinetic energy in the range of 500 to 1,000 eV;
impinging said ionized beam onto said substrate to form said diamondlike carbon coating on said substrate; and
scanning said ion beam relative to said substrate to uniformly form said diamondlike carbon coating on said substrate.

14. A method as defined in claim 13 wherein said scanning step maintains said substrate below about 80° C.

15. The method as defined in claim 13 wherein said ionized beam is comprised of decomposed methane molecules.

16. The method as defined in claim 13 wherein a methane gas pressure in the ionization chamber is between about $2.6 \times 10^{-4}$ and $6 \times 10^{-5}$ torr.

17. The method as defined in claim 13 wherein said substrate is selected from the group consisting essentially of silicon, fused silica, Lexan, KG-3 glass, BK-7 glass, zinc sulfide and heavy metal fluorides.

18. The method as defined in claim 13 wherein said diamondlike carbon coating includes less than about 40% hydrogen and less than about 80% hydrogen is present in the ionization chamber.

19. The method as defined in claim 13 wherein said diamondlike carbon coating includes less than about 40% hydrogen and less than about 80% hydrogen is present in the ionization chamber.

20. A method of forming a diamondlike carbon coating on a substrate selected from the group consisting of ZnS and ZnSe, comprising the steps of:
generating a carbon containing ionized beam having an ion kinetic energy in the range of about 500 to 1,500 eV; and
impinging said ionized beam onto said substrate selected from the group consisting of ZnS and ZnSe to form said diamondlike carbon coating on said substrate.

21. The method as defined in claim 20 wherein said diamondlike carbon coating contains between 30-41% hydrogen.

22. The method as defined in claim 21 wherein the range of methane gas concentration and hydrogen gas concentration in forming said ionized beam is between pure methane and 80% hydrogen and 20% methane.

23. The method as defined in claim 21 wherein the range of methane gas concentration and hydrogen gas concentration in forming said ionized bean is between pure methane and 80% hydrogen and 20% methane.

* * * * *